(12) United States Patent
Choi et al.

(10) Patent No.: US 8,084,839 B2
(45) Date of Patent: Dec. 27, 2011

(54) CIRCUIT BOARD HAVING CONDUCTIVE SHIELD MEMBER AND SEMICONDUCTOR PACKAGE USING THE SAME

(75) Inventors: Bok Kyu Choi, Gyeonggi-do (KR); Sang Joon Lim, Gyeonggi-do (KR); Eul Chul Jang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/871,072

(22) Filed: Aug. 30, 2010

(65) Prior Publication Data

US 2010/0321900 A1 Dec. 23, 2010

Related U.S. Application Data

(62) Division of application No. 12/117,229, filed on May 8, 2008, now Pat. No. 7,808,072.

(30) Foreign Application Priority Data

Mar. 7, 2008 (KR) ........................ 10-2008-0021589

(51) Int. Cl.
*H01L 29/00* (2006.01)
*H01L 23/52* (2006.01)
*H01L 23/48* (2006.01)
*H01L 29/40* (2006.01)
*H01L 23/538* (2006.01)
*H01L 23/00* (2006.01)

(52) U.S. Cl. .. 257/508; 257/774; 257/686; 257/E23.174

(58) Field of Classification Search ................... 257/508, 257/686, 774, E23.174
See application file for complete search history.

(56) References Cited

U.S. PATENT DOCUMENTS

| | | | |
|---|---|---|---|
| 5,587,119 A | 12/1996 | White | |
| 5,849,030 A | 12/1998 | Taheri | |
| 6,717,071 B2 | 4/2004 | Chang et al. | |
| 6,787,710 B2 | 9/2004 | Uematsu et al. | |
| 7,230,318 B2 * | 6/2007 | Kripesh et al. | ................ 257/621 |
| 7,317,166 B2 | 1/2008 | Nakamura | |
| 7,408,120 B2 | 8/2008 | Kim et al. | |
| 7,508,079 B2 | 3/2009 | Higashi | |
| 7,589,390 B2 | 9/2009 | Yao | |
| 2007/0222021 A1 | 9/2007 | Yao | |

FOREIGN PATENT DOCUMENTS

| | | |
|---|---|---|
| CN | 11223543 A | 7/1999 |
| CN | 1655662 A | 8/2005 |
| JP | 2003-243439 A | 8/2003 |
| KR | 10-0546411 B1 | 1/2006 |
| KR | 1020080021161 A | 3/2008 |

OTHER PUBLICATIONS

USPTO Office Action mailed Dec. 1, 2009 for U.S. Appl. No. 12/117,229.
USPTO Office Action mailed Feb. 3, 2010 for U.S. Appl. No. 12/117,229.
USPTO Notice of Allowance mailed Jun. 2, 2010 for U.S. Appl. No. 12/117,229.

* cited by examiner

*Primary Examiner* — Luan C Thai
(74) *Attorney, Agent, or Firm* — Ladas & Parry LLP

(57) ABSTRACT

A circuit board having a board body includes a via structure. The via structure includes a conductive connector passing through the board body and a conductive shield member surrounding at least a portion of the conductive connector. The shield member prevents distortion of a data signal applied to the conductive connector, and also intercepts electromagnetic waves generated by the conductive connector.

6 Claims, 4 Drawing Sheets

CIRCUIT BOARD HAVING CONDUCTIVE SHIELD MEMBER AND SEMICONDUCTOR PACKAGE USING THE SAME

CROSS-REFERENCE TO RELATED APPLICATIONS

The present application claims priority to Korean patent application number 10-2008-0021589 filed on Mar. 7, 2008, which is incorporated herein by reference in its entirety.

BACKGROUND OF THE INVENTION

The present invention relates to a circuit board and a semiconductor package using the same, and more particularly to a circuit board having a conductive shield member and a semiconductor package using the same.

Recent developments in the electronics industry have led to technologies including circuit boards for mounting various electronic devices.

Circuit boards, on which the devices are mounted, typically include single-layered circuit patterns or multi-layered circuit patterns. When a circuit board having a multi-layered circuit pattern is used, conductive vias are formed to electrically connect the circuit patterns of the different layers.

Developments in circuit boards have led to the decrease in size of a circuit board. When the size of the circuit board decreases, there is a considerable reduction in the size of the conductive vias for electrically connecting the circuit patterns located on different layers and a considerable reduction in the distance between neighboring conductive vias. As a consequence of these reductions, signals become distorted while being transmitted through the conductive vias.

SUMMARY OF THE INVENTION

Embodiments of the present invention include a circuit board having a via structure for preventing the distortion of a signal.

Additionally, embodiments of the present invention include a semiconductor package having the via structure.

In one aspect, a circuit board comprises a board body and a via structure having a conductive connector passing through the board body and a conductive shield member surrounding at least a portion of the conductive connector to reduce distortion of a signal applied to the conductive connector.

The conductive connector can have a column shape.

Alternatively, the conductive shield member can have a curved shape.

A surface of the conductive connector and a surface of the conductive shield member are spaced apart from each other by a substantially equal distance.

The circuit board may also include at least two conductive shield members located around the conductive connector and separated from the conductive connector by an equal distance.

The circuit board further comprises a first wiring line located on an upper surface of the board body and electrically connected to the conductive connector; a second wiring line located on the upper surface of the board body and electrically connected to the conductive shield member; and a third wiring line located on a lower surface of the board body and electrically connected to the conductive connector. The first and third wiring lines are electrically insulated from the conductive shield member.

A first signal is applied to the conductive connector, and a second signal is applied to the conductive shield member.

The first signal is a data signal, and the second signal is any one of a power source signal and a ground signal.

In another aspect, a circuit board comprises a board body is having a through-hole; a conductive shield member located on an inner surface of the board body (which is formed by the through-hole); an insulation member covering surfaces of the board body and a surface of the conductive shield member; and a conductive connector located on the insulation member at a position corresponding to the conductive shield member.

The circuit board further comprises a first wiring line located on the board body and electrically connected to the conductive shield member; and second wiring lines located on the insulation member and electrically connected to the conductive connector.

The conductive connector has any one of a column shape and a pipe shape.

The conductive shield member has a pipe shape.

In still another aspect, a semiconductor package comprises a first semiconductor package having a first substrate having a first region, a second region defined around the first region and first connection pads located in the second region, and a first semiconductor chip located in the first region and electrically connected to the first connection pads; a second semiconductor package located on the first semiconductor package and having a second substrate having a third region corresponding to the first region, a fourth region corresponding to the second region and second connection pads located in the fourth region, and a second semiconductor chip located in the third region is electrically connected to the second connection pads; conductive connectors electrically connected with the first connection pads and the second connection pads receiving first signals; and conductive shield members located between the first and second substrates, receiving second signals, and surrounding at least respective portions of the conductive connectors to prevent distortion of the first signals.

The conductive connectors have a pin shape, and the conductive shield members have a cylindrical shape.

Alternatively, the conductive shield members can have the shape of a partially open cylinder.

Both ends of the conductive shield members may be located inside the first and second substrates.

The first signals are data signals, and each second signal is any one of a power source signal and ground signal.

The conductive connectors are located in a zigzag pattern when viewed from above the semiconductor package.

DESCRIPTION OF SPECIFIC EMBODIMENTS

Figure 1:
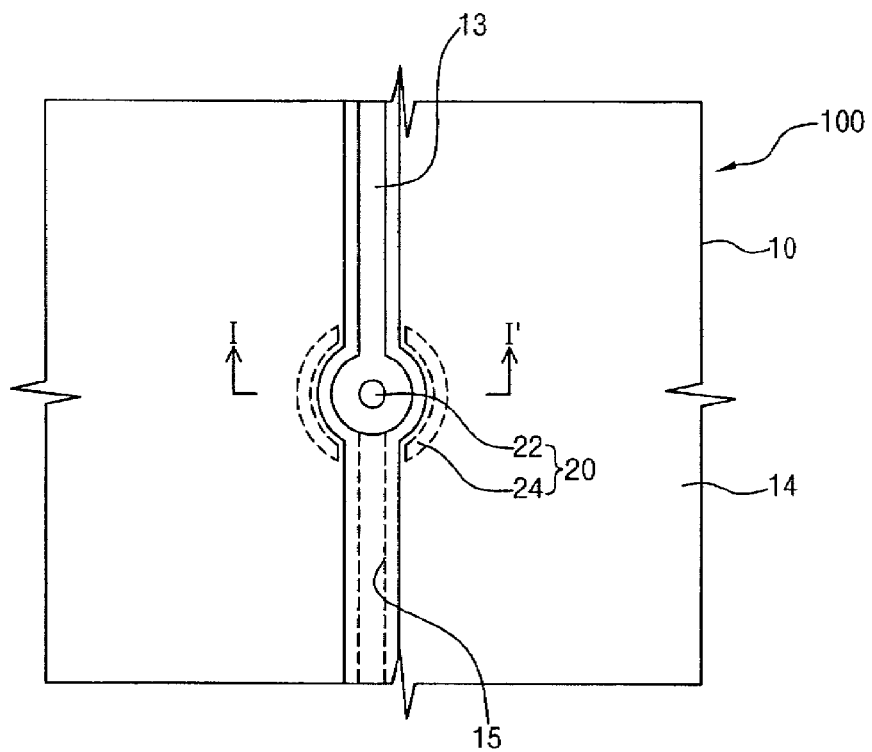
FIG. 1 is a plan view showing a circuit board in accordance with an embodiment of the present invention.
Figure 2:
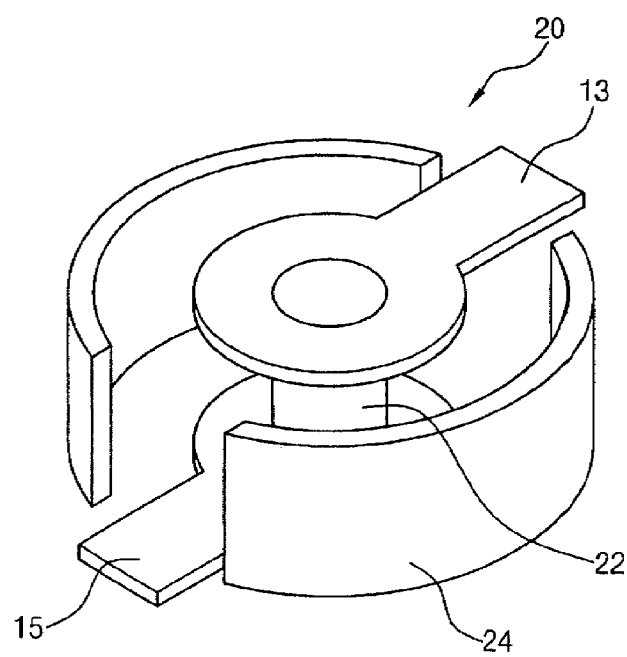
FIG. 2 is a perspective view showing the via structure of FIG. 1.
Figure 3:
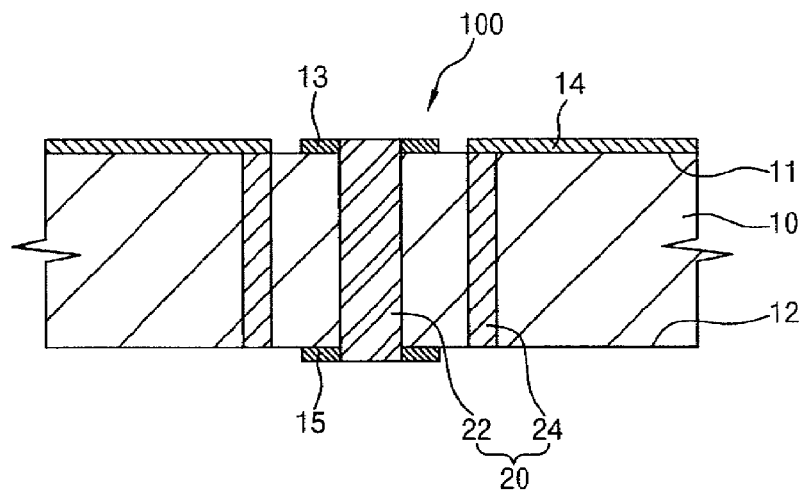
FIG. 3 is a cross-sectional view taken along line of FIG. 1.

FIG. 1 is a plan view showing a circuit board in accordance with an embodiment of the present invention. FIG. 2 is a perspective view showing the via structure of FIG. 1. FIG. 3 is a cross-sectional view taken along line I-I' of FIG. 1.

Referring to FIGS. 1 through 3, a circuit board 100 includes a board body 10 and a via structure 20.

As shown in FIG. 3, the board body 10 has an upper surface 11 and a lower surface 12 facing away from (opposite to) the upper surface 11. A first wiring line 13 and a second wiring line 14 are positioned on the upper surface 11, and a third wiring line 15 is positioned on the lower surface 12. The first and second wiring lines 13, 14 are electrically insulated from one another.

The first wiring line 13 and the third wiring line 15 can, for example, have a linear shape when viewed from above, whereas the second wiring line 14 can, for example, have a plate shape when viewed from above.

A first signal, such as a data signal, can be applied to the first wiring line 13 and the third wiring line 15. The first wiring line 13 and the third wiring line 15 are electrically connected to each other by a conductive connector (or a first via) 22 of the via structure 20 (described in more detail below).

A second signal, such as a power source signal or a ground signal, is applied to the second wiring line 14. The second wiring line 14 is electrically connected to a conductive shield member (or a second via) 24 of the via structure 20 (described in more detail below).

Referring again to FIGS. 2 and 3, the via structure 20 includes the conductive connector 22 and the conductive shield member 24.

The conductive connector 22 passes from the upper surface 11 to the lower surface 12 of the board body 10. The conductive connector 22 can have, for example, a column or pipe shape. In the embodiment shown in FIGS. 1-3, the conductive connector 22 has the shape of a circular column.

The conductive connector 22 electrically connects the first wiring line 13 to the third wiring line 15. Accordingly, when a first signal is applied to the first wiring line 13, it can be outputted from the third wiring line 15 via the conductive connector 22. Conversely, when the first signal is applied to the third wiring line 15, it can be outputted from the first wiring line 13 via the conductive connector 22.

In the present embodiment, exemplary materials used to form the conductive connector 22 include copper, aluminum, and aluminum alloy.

The conductive shield member 24 is located in the board body 10. Also, the conductive shield member 24 is positioned outside the conductive connector 22.

The first signal inputted to the first wiring line 13 or the third wiring line 15 may become distorted as a result of the location and the size of the conductive connector 22. In addition, when the first signal (which is inputted to the first wiring line 13 or the third wiring line 15) passes through the conductive connector 22, a substantial amount of electromagnetic waves are generated.

The conductive shield member 24 surrounds at least a portion of the conductive connector 22 to prevent the first signal (which is inputted to the first wiring line 13 or the third wiring line 15) from being distorted while passing through the conductive connector 22. The conductive shield member 24 intercepts both electromagnetic waves generated while the first signal (which is inputted to the first wiring line 13 or the third wiring line 15) passes is through the conductive connector 22 and outside electromagnetic waves incident to the conductive connector 22.

In order to ensure that the conductive shield member 24 effectively prevents distortion of the first signal inputted to the first wiring line 13 or the third wiring line 15, and effectively intercepts electromagnetic waves, the conductive shield member 24 is electrically connected to the second wiring line 14, and a second signal, such as a power source signal or a ground signal, is applied to the conductive shield member 24.

In the present embodiment, at least one conductive shield member 24 is positioned around the conductive connector 22. The conductive shield member 24 can have, for example, a plate shape of a plate surrounding the conductive connector 22.

Two conductive shield members 24, for example, can be positioned around the conductive connector 22, such that the conductive shield members 24 are spaced apart from each other by a predetermined distance. The first wiring line 13 and the third wiring line 15 pass between the spaces between the two conductive shield members 24. The conductive shield members 24 are electrically insulated from the first wiring line 13 and the third wiring line 15.

In the present embodiment, the conductive shield members 24 can have, for example, a curved plate shape. The surface of each conductive shield member 24 facing the conductive connector 22 can be separated from the outer surface of the conductive connector 22 by an equal distance.

Figure 4:
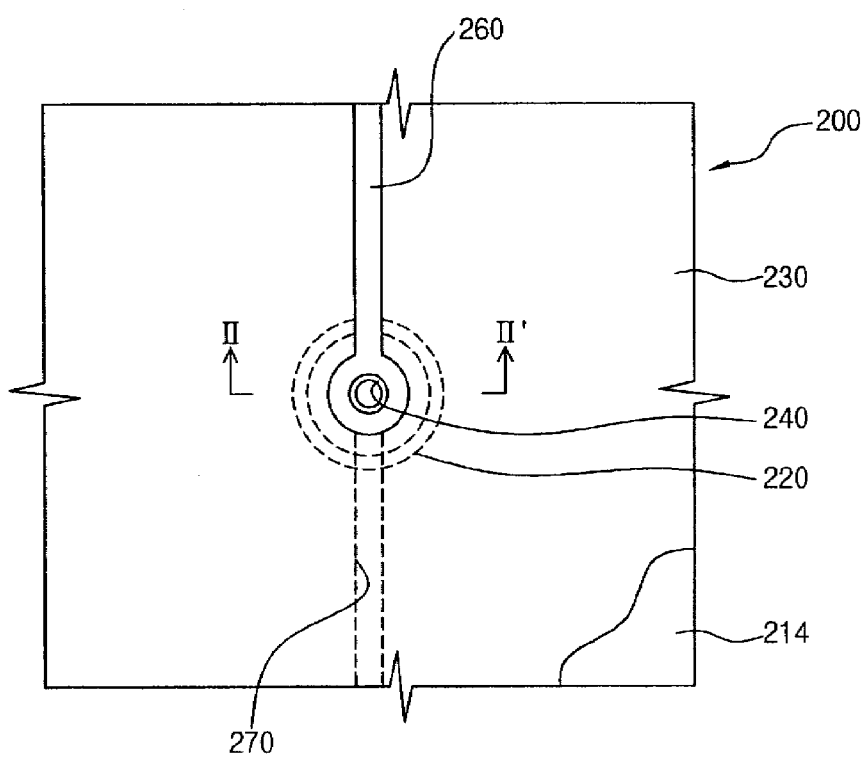
FIG. 4 is a plan view showing a circuit board in accordance with another embodiment of the present invention.
Figure 5:
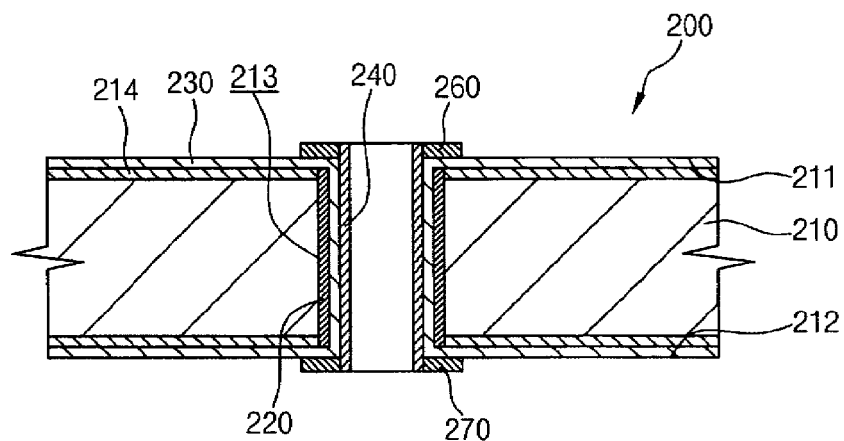
FIG. 5 is a cross-sectional view taken along line of FIG. 4.

FIG. 4 is a plan view showing a circuit board in accordance with another embodiment of the present invention. FIG. 5 is a cross-sectional view taken along line II-II' of FIG. 4.

Referring to FIGS. 4 and 5, the circuit board 200 includes a board body 210, a conductive shield member 220, an insulation member 230, and a conductive connector 240.

The board body 210 can be, for example, a printed circuit board having an upper surface 211 and a lower surface 212 facing away from (opposite to) the upper surface 211. The board body 210 has a through-hole 213 passing through the upper surface 211 and the lower surface 212. A first wiring line 214 can be positioned, for example, on the upper surface 211 of the board body 210. In the present embodiment, the first wiring line 214 has a plate shape when viewed from above. Alternatively, the first wiring line 214 can have a linear shape when viewed from above. Also, the first wiring line 214 can be positioned on the lower surface 212 of the board body 210.

A first signal, such as a power source signal or a ground signal, can be applied to the first wiring line 214.

The conductive shield member 220 is formed in the through-hole on the inner surface of the board body 210 (the inner surface is formed due to the presence of the through-hole 213). In the present embodiment, the conductive shield member 220 can have, for example, a hollow pipe shape. The conductive shield member 220 is electrically connected to the first wiring line 214 positioned on the upper surface 211 of the board body 210. Accordingly, the first signal (e.g. a power source signal or a ground signal) is applied to the conductive shield member 220.

The insulation member 230 covers the upper surface 211 and the lower surface 212 of the board body 210 and the inner surface of the hollow conductive shield member 220. The insulation member 230 electrically insulates the first wiring line 214 and the conductive shield member 220 from a second wiring line, a third wiring line, and the conductive connector 240 (described in more detail below). The insulation member 230 may comprise an organic layer containing an organic substance or an inorganic layer containing an inorganic substance.

The conductive connector 240 is positioned on the surface of the insulation member 230 corresponding to the through-hole 213. In the present embodiment, the conductive connector 240 can, for example, have a hollow pipe shape. Alternatively, the to conductive connector 240 can have a column shape.

Exemplary materials, suitable for the formation of the conductive connector 240 include: copper, aluminum, and aluminum alloy.

A second wiring line 260 can be positioned on the surface is of the insulation layer 230 corresponding to the upper surface 211 of the board body 210, and a third wiring line 270 can be positioned on the surface of the insulation layer 230 corresponding to the lower surface 212 of the board body 210. In the present embodiment, a second signal, such as a data signal, is applied to the second wiring line 260 or the third wiring line 270.

The second wiring line 260 and/or the third wiring line 270 can have, for example, a linear shape when viewed from above and are electrically connected to the conductive connector 240. Accordingly, when the second signal is applied to the second wiring line 260, the second signal is outputted from the third wiring line 270 via the conductive connector 240; and when the second signal is applied to the third wiring line 270, the second signal is outputted from the second wiring line 260 via the conductive connector 240.

In the present embodiment, by positioning the conductive shield member 220 (to which the first signal such as a power source signal or a ground signal is applied) around the conductive connector 240, it is possible both to effectively prevent distortion of the second signal applied to the conductive connector 240 and to effectively intercept electromagnetic waves generated by the conductive connector 240.

Figure 6:
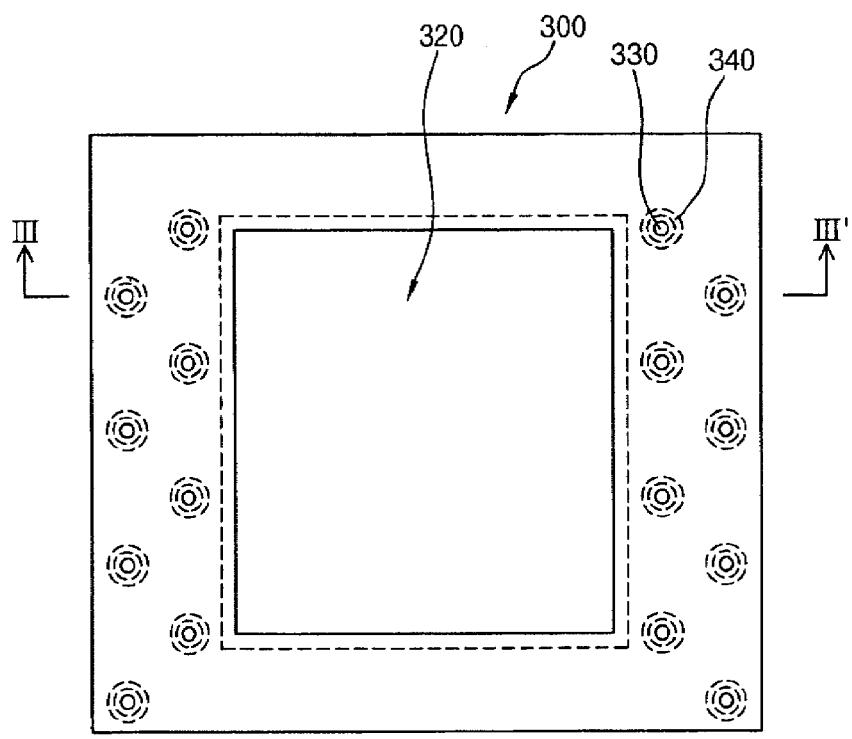
FIG. 6 is a plan view showing a semiconductor package having the conductive connector and the conductive shield member of FIGS. 1 through 5.
Figure 7:
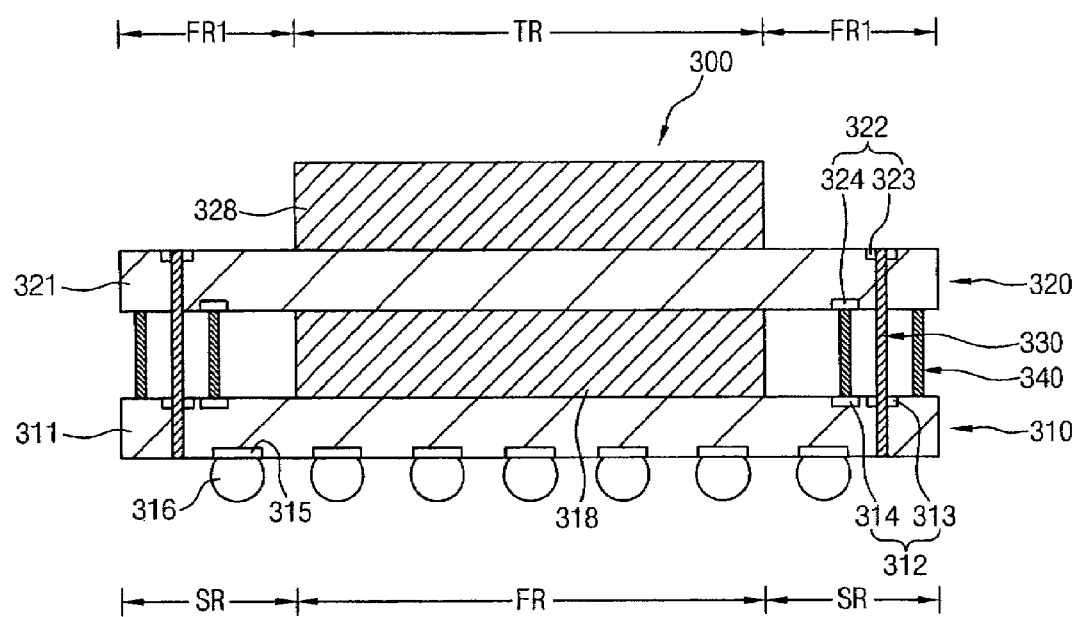
FIG. 7 is a cross-sectional view taken along line of FIG. 6.

FIG. 6 is a plan view showing a semiconductor package having the conductive connector and the conductive shield member shown in FIGS. 1 through 5. FIG. 7 is a cross-sectional view taken along the line III-III' of FIG. 6.

Referring to FIGS. 6 and 7, a semiconductor package 300 includes a first semiconductor package 310, a second semiconductor package 320, conductive connectors 330, and conductive shield members 340.

The first semiconductor package 310 has a first substrate 311 and a first semiconductor chip 318.

The first substrate 311 has, for example, a quadrangular plate shape. The quadrangular shaped first substrate 311 has a centrally located first region FR and a second region SR surrounding the first region FR. The first semiconductor chip 318 is mounted in the first region FR.

First connection pads 312 are positioned in the second region SR on the upper surface of the first substrate 311. The first connection pads 312 include first data connection pads 313, to which data signals are applied, and first power source (or ground) connection pads 314, to which power source signals (or ground signals) are applied.

Ball lands 315 are positioned on the lower surface of the to first substrate 311. Respective ball lands 315 are electrically connected to corresponding first connection pads 312. Solder balls 316 are electrically connected to respective ball lands 315.

The first semiconductor chip 318 is mounted to the upper surface of the first substrate 311 in the first region FR. In the present embodiment, the first semiconductor chip 318 has a circuit section (not shown) and bonding pads (not shown) electrically connected to the circuit section. The bonding pads are also electrically connected to the first connection pads 312. The bonding pads and the first connection pads 312 can be electrically connected to each other using the wiring lines (described above) positioned on the first substrate 311. Alternatively, the bonding pads and the first connection pads 312 can be electrically connected to each other using conductive wires (not shown).

The second semiconductor package 320 is positioned on the first semiconductor chip 318 of the first semiconductor package 310.

The second semiconductor package 320 has a second substrate 321 and a second semiconductor chip 328.

The second substrate 321 has, for example, a quadrangular plate shape and is positioned on the first semiconductor chip 318. The quadrangular shaped second substrate 321 has a centrally located third region TR and a fourth region FR1 surrounding the third region TR. In the present embodiment, the third region TR corresponds to the first region FR, and the fourth region FR1 corresponds to the second region SR. The second semiconductor chip 328 is mounted in the third region TR.

Second connection pads 322 are positioned in the fourth region FR1 of the second substrate 321. The second connection pads 322 include second data connection pads 323, to which data signals are applied, and second power source (or ground) connection pads 324, to which power source signals (or ground signals) are applied. In the present embodiment, respective second connection pads 322 are located at positions corresponding to respective first connection pads 312.

The second semiconductor chip 328 is mounted on the upper surface of the second substrate 321 in the third region TR. In the present embodiment, the second semiconductor chip 328 has a circuit section (not shown) and bonding pads (not shown) electrically connected to the circuit section. The bonding pads are also electrically connected to the second connection pads 322.

The bonding pads and the second connection pads 322 can be electrically connected to each other using wiring lines (described above) positioned on the second substrate 321. Alternatively, the bonding pads and the second connection pads 322 can be electrically connected to each other using conductive wires (not shown).

Each conductive connector 330 has, for example, a pin shape. One end of the conductive connector 330 is electrically connected to the first data connection pad 313 of the first connection pad 312 through the first substrate 311, and the opposite end of the conductive connector 330 is electrically connected to the second data connection pad 323 of the second connection pad 322 through the second substrate 321.

FIG. 6 shows an embodiment of the present invention in which the conductive connectors 330 are positioned in a zigzag pattern. The zigzag allows an increased number of conductive connectors 330 to be positioned within a limited area.

Data signals are input to the conductive connectors 330. As described above, the data signals applied to the conductive connectors 330 can be distorted while they travel from the first substrate 311 to the second substrate 321. Further, the conductive connectors 330 (to which the data signals are applied) generate a substantial amount of electromagnetic waves.

The conductive shield members 340 are positioned between the first and second substrates 311 and 321 in order to both reduce distortion of the data signals applied to the conductive connectors 330 and intercept electromagnetic waves. In the present embodiment, each conductive shield member 340 may have, for example, a cylindrical shape. Alternatively, the conductive shield member 340 may have a 'U' shape or a 'C' shape that to surrounds a portion of the conductive connector 330 when viewed from above.

The conductive shield members 340 are electrically connected to the first power source connection pads 314 of the first substrate 311 and the second power source connection pads 324 of is the second substrate 321 in order to reduce the distortion of the first signals applied to the conductive connectors 330.

In the present embodiment, the conductive shield members 340 are interposed between the first and second substrates 311 and 321. However, alternatively, the ends of the conductive shield members 340 can, of course, be positioned within the first and second substrates 311 and 321.

As is apparent from the above description, in the present invention, a conductive shield member (to which a power source signal or a ground signal is applied) is positioned to shield a conductive connector (to which a data signal is applied); and as a result, the present invention prevents both signal distortion and the generation of electromagnetic waves from the conductive connector.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A semiconductor package comprising:
   a first semiconductor package comprising:
      a first substrate having a first region and a second region outside of the first region;
      first connection pads disposed in the second region, and
      a first semiconductor chip disposed in the first region, the first semiconductor chip being electrically connected to the first connection pads;
   a second semiconductor package disposed over the first semiconductor package, the second semiconductor package comprising:
      a second substrate having a third region corresponding to the first region and a fourth region corresponding to the second region;
      second connection pads disposed in the fourth region; and
      a second semiconductor chip disposed in the third region, the second semiconductor chip being electrically connected to the second connection pads;
   a conductive connector electrically connecting a respective one of the first connection pad to a respective one of the second connection pads, wherein a first signal is applied to the conductive connector; and
   a conductive shield member disposed between the first and second substrates and shielding at least a portion of the conductive connector to prevent distortion of the first signal, wherein a second signal is applied to the conductive shield member.

2. The semiconductor package according to claim 1, wherein the conductive connector has a pin shape, and the conductive shield member has a cylindrical shape.

3. The semiconductor package according to claim 1, wherein the conductive shield member has the shape of a partially open cylinder.

4. The semiconductor package according to claim 1, wherein a first end of the conductive shield member is located within the first substrate and a second end of the conductive shield member is located within the second substrate.

5. The semiconductor package according to claim 1, wherein the first signal is a data signal, and the second signal is any one of a power source signal and a ground signal.

6. The semiconductor package according to claim 1, wherein a plurality of the conductive connectors connect the first connection pads to the second connection pads, and the conductive connectors form a zigzag pattern when viewed from above the semiconductor package.

* * * * *